(12) United States Patent
Nakamura (10) Patent No.: US 8,787,859 B2
(45) Date of Patent: Jul. 22, 2014

(54) AUTOMATIC GAIN CONTROL APPARATUS AND METHOD

(75) Inventor: Masaru Nakamura, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 22 days.

(21) Appl. No.: 13/484,993

(22) Filed: May 31, 2012

(65) Prior Publication Data

US 2012/0319775 A1 Dec. 20, 2012

(30) Foreign Application Priority Data

Jun. 15, 2011 (JP) ................................ 2011-133286

(51) Int. Cl.
*H04B 1/06* (2006.01)
*H04B 17/00* (2006.01)

(52) U.S. Cl.
USPC ..................................... 455/245.2; 455/247.1

(58) Field of Classification Search
USPC .............................. 455/232.1–253.2; 375/345
See application file for complete search history.

(56) References Cited

U.S. PATENT DOCUMENTS

| | | | |
|---|---|---|---|
| 5,303,258 A | 4/1994 | Nakamura | |
| 6,041,074 A | 3/2000 | Nakamura | |
| 6,055,266 A | 4/2000 | Nakamura | |
| 6,205,169 B1 | 3/2001 | Nakamura | |
| 8,160,527 B2 * | 4/2012 | Jonsson et al. | 455/226.1 |

FOREIGN PATENT DOCUMENTS

| | | |
|---|---|---|
| JP | 58-156206 A | 9/1983 |
| JP | 2005-210690 A | 8/2005 |
| JP | 2009-005409 A | 1/2009 |

OTHER PUBLICATIONS

English Language Abstract for Japanese Patent Publication No. 4212548 published on Jan. 21, 2009.

* cited by examiner

*Primary Examiner* — Lee Nguyen
(74) *Attorney, Agent, or Firm* — Harness, Dickey & Pierce, P.L.C.

(57) ABSTRACT

An automatic gain control apparatus for a wireless receiver, including multiple variable gain amplifiers, one variable gain amplifier provided for each one of multiple receive chains and a gain controller to control a gain of the variable gain amplifiers provided for the plurality of receive chains. The gain controller includes multiple output level measurement units to measure an output level of a corresponding receive chain; a common gain determination unit to determine a common gain for each of the variable gain amplifiers based on a statistical value obtained from the output levels; multiple adjusted gain determination units, each adjusted gain determination unit determining an adjusted gain independently for each variable gain amplifier within a range narrower than the range of the common; and a gain setting unit to set a gain to each of the variable gain amplifiers based on the common gain and the adjusted gain.

12 Claims, 10 Drawing Sheets

| N-TH TIMES OF GAIN CONTROL | COMMON GAIN Gt | ADJUSTED COEFFICIENT Gadj | AVERAGE OUTPUT LEVEL | DETERMINATION |
|---|---|---|---|---|
| FIRST TIME | 96dB | 48dB | 36dBm | TOO GREAT |
| SECOND TIME | 48dB | 24dB | -12dBm | TOO SMALL |
| THIRD TIME | 72dB | 12dB | 12dBm | TOO GREAT |
| FOURTH TIME | 60dB | 6dB | 0dBm | OK |

FIG. 12

AUTOMATIC GAIN CONTROL APPARATUS AND METHOD

CROSS-REFERENCE TO RELATED APPLICATION

This application claims priority to Japanese Patent Application No. 2011-133286, filed on Jun. 15, 2011 in the Japan Patent Office, which is incorporated by reference herein in its entirety.

BACKGROUND

1. Technical Field

The present invention relates to an automatic gain control apparatus and an automatic gain control method, and more particularly to an automatic gain control apparatus for a wireless receiver having a plurality of receive chains, and an automatic gain control method.

2. Description of the Background Art

Automatic gain control apparatuses are used for data communication over wireless local area networks (WLAN) or the like, in which packet signals are transmitted from one apparatus to another apparatus having one or more receive chains. In such a configuration, the received signal power for each receive chain may fluctuate between a part used for multiple-input multiple-output (MIMO) of the packet signals and a part not used for MIMO of the packet signals. The output level of each receive chain is measured by shifting or chaining preamble signals disposed at the front of the MIMO-part for conducting automatic gain control (AGC) for each one of the receive chains, in which the preamble signals may be time-shifted or frequency-shifted. Thus, for example, JP-4212548-B discloses a configuration to improve output performance of receive chains by minimizing fluctuation in reception power among the receive chains.

Figure 1:
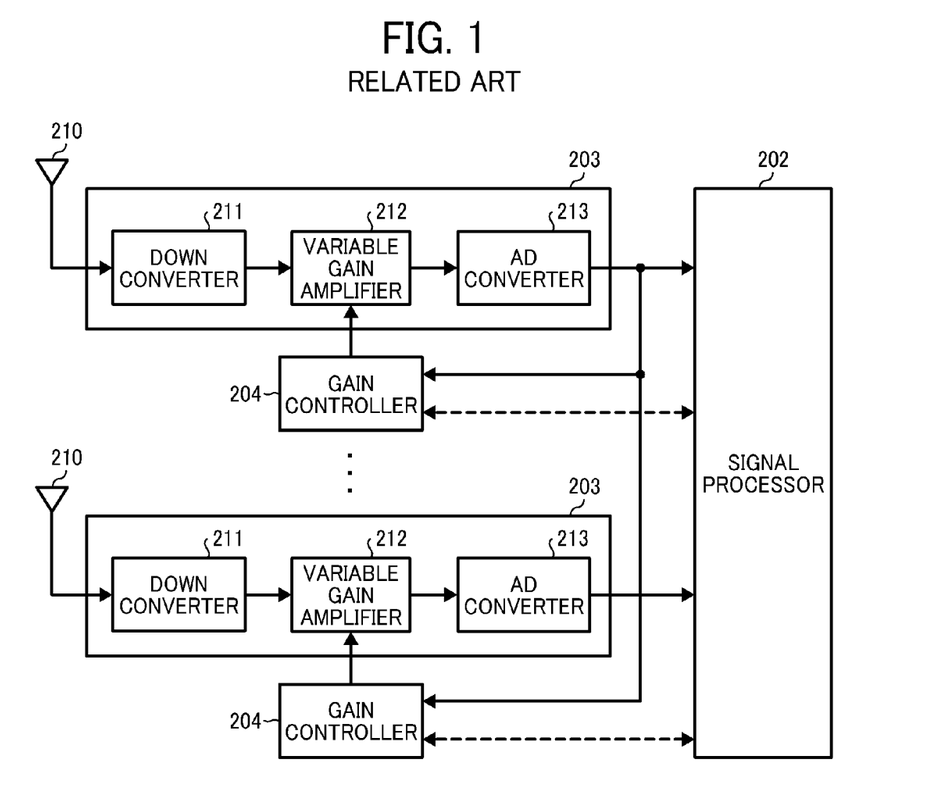
FIG. 1 shows a block diagram of conventional automatic gain control apparatus.

JP-4212548-B discloses a configuration in which a plurality of receive chains 203 is connected to a signal processor 202, as shown in FIG. 1. Each one of the receive chains 203 includes an antenna 210, a down converter 211, a variable gain amplifier 212, and an analog-to-digital (AD) converter 213. Further, a gain controller 204 is provided for each of the receive chains 203. Accordingly, the gain is set independently for each one of the variable gain amplifiers 212 of the corresponding receive chain 203.

Figure 2:
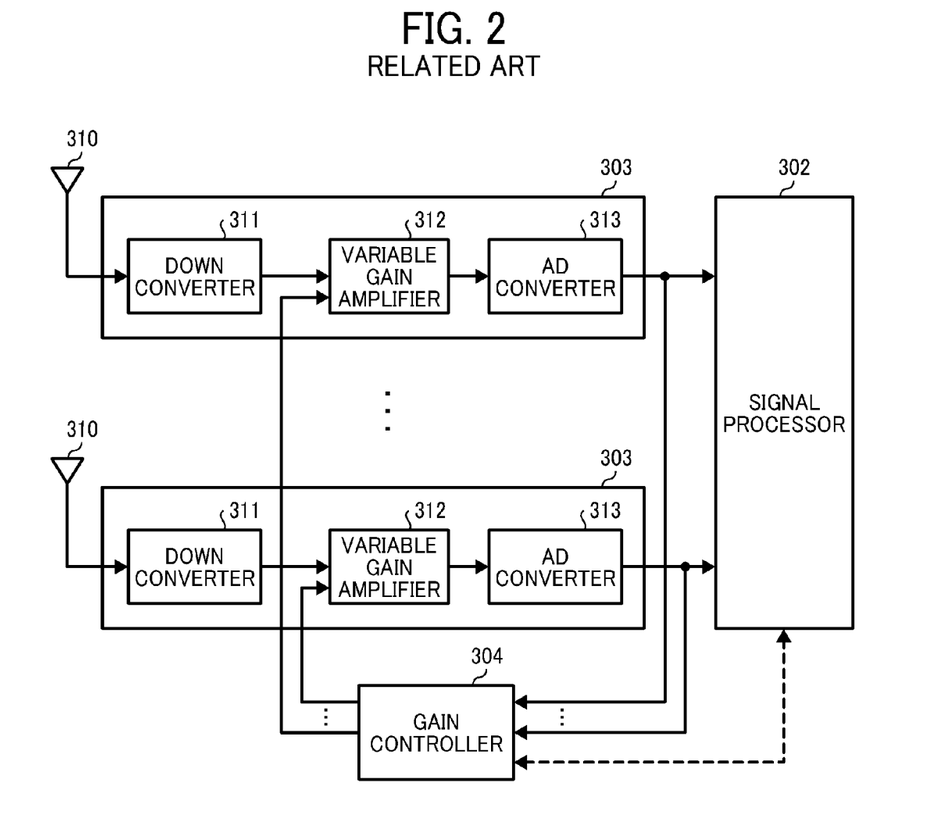
FIG. 2 shows a block diagram of another conventional automatic gain control apparatus.

JP-4212548-B further discloses a configuration in which a plurality of receive chains 303 is connected to a signal processing unit 302 as shown in FIG. 2. Each one of the receive chains 303 includes an antenna 310, a down converter 311, a variable gain amplifier 312, and an AD converter 313. A single gain controller 304 is provided for all the receive chains 303. As a result, the gain of the variable gain amplifier 312 of every one of the receive chains 303 is the same.

However, with the configuration shown in FIG. 1, if the output level of one specific receive chain 203 becomes too small compared to the output level of the other receive chains 203 due to interference or the like, the signal-to-noise ratio (SNR) of the specific receive chain 203 also deteriorates substantially. In such a case, the signal received by the specific receive chain 203 is amplified so that the output level of specific receive chain 203 becomes the same as that of the other receive chains 203.

However, such amplification process also amplifies the noise component in the received signal, and such amplified noise component is input to a later stage unit such as the signal processor 202, thereby degrading signal receiving performance. As such, the receiving performance of the automatic gain control apparatus shown in FIG. 1 deteriorates.

Further, with the configuration shown in FIG. 2, the same gain is set to the variable gain amplifier 312 for every one of the receive chains 303. In such a case, the output levels among the receive chains 303 after gain control may vary substantially due to the effects of interference or the like.

If output levels among the receive chains 303 of the conventional automatic gain control apparatus of FIG. 2 fluctuate, receiving performance deteriorates. For example, an overflow occurs at the receive chain 303 having a high receiving level when the analog-to-digital (AD) conversion is conducted, and a decrease in effective number of bits of signals and resultant increase of quantization noise occurs at the receive chain 303 having a low receiving level.

SUMMARY

In one aspect of the present invention, an automatic gain control apparatus for a wireless receiver is devised. The automatic gain control apparatus for a wireless receiver includes a plurality of variable gain amplifiers, one variable gain amplifier provided for each one of a plurality of receive chains; and a gain controller to control a gain of the variable gain amplifiers provided for the plurality of receive chains. The gain controller includes a plurality of output level measurement units, each output level measurement unit to measure an output level of a corresponding receive chain; a common gain determination unit to determine a common gain for each of the variable gain amplifiers based on a statistical value obtained from the output levels measured by the plurality of output level measurement units; a plurality of adjusted gain determination units, each adjusted gain determination unit determining an adjusted gain independently for each variable gain amplifier within a range narrower than the range of the common gain based on an output level of a corresponding receive chain measured after the gain setting unit sets the common gain to each one of the variable gain amplifiers of the corresponding receive chains; and a gain setting unit to set a gain to each of the variable gain amplifiers based on the common gain and the adjusted gain.

In another aspect of the present invention, an automatic gain control method using an automatic gain control apparatus for a wireless receiver is devised. The automatic gain control apparatus includes a plurality of variable gain amplifiers, one variable gain amplifier provided for each of a plurality of receive chains, and a gain controller to control a gain of the variable gain amplifiers provided for each of the plurality of receive chains. The method includes an output level measurement step of measuring an output level of each of the receive chains; a common gain determination step of determining a common gain for each of the variable gain amplifiers based on a statistical value obtained from the output level of each of the receive chains measured by the output level measurement step; a first gain setting step of setting the common gain, determined at the common gain determination step, to each of the variable gain amplifiers; an adjusted gain determination step determining an adjusted gain independently for each of the variable gain amplifiers with a range narrower than a range of the common gain based on an output level of the corresponding receive chain measured after setting the common gain to each one of the variable gain amplifiers of the corresponding receive chain; and a second gain setting step of setting a gain based on the common gain and the adjusted gain to each of the variable gain amplifiers.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

The accompanying drawings are intended to depict exemplary embodiments of the present invention and should not be interpreted to limit the scope thereof. The accompanying drawings are not to be considered as drawn to scale unless explicitly noted, and identical or similar reference numerals designate identical or similar components throughout the several views.

DETAILED DESCRIPTION OF EXEMPLARY EMBODIMENTS

A description is now given of exemplary embodiments of the present invention. It should be noted that although such terms as first, second, etc. may be used herein to describe various elements, components, regions, layers and/or sections, it should be understood that such elements, components, regions, layers and/or sections are not limited thereby because such terms are relative, that is, used only to distinguish one element, component, region, layer or section from another region, layer or section. Thus, for example, a first element, component, region, layer or section discussed below could be termed a second element, component, region, layer or section without departing from the teachings of the present invention.

In addition, it should be noted that the terminology used herein is for the purpose of describing particular embodiments only and is not intended to be limiting of the present invention. Thus, for example, as used herein, the singular forms "a", "an" and "the" are intended to include the plural forms as well, unless the context clearly indicates otherwise. Moreover, the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Furthermore, although in describing views shown in the drawings, specific terminology is employed for the sake of clarity, the present disclosure is not limited to the specific terminology so selected and it is to be understood that each specific element includes all technical equivalents that operate in a similar manner and achieve a similar result. Referring now to the drawings, an apparatus or system according to an example embodiment is described hereinafter.

First Example Embodiment

Figure 3:
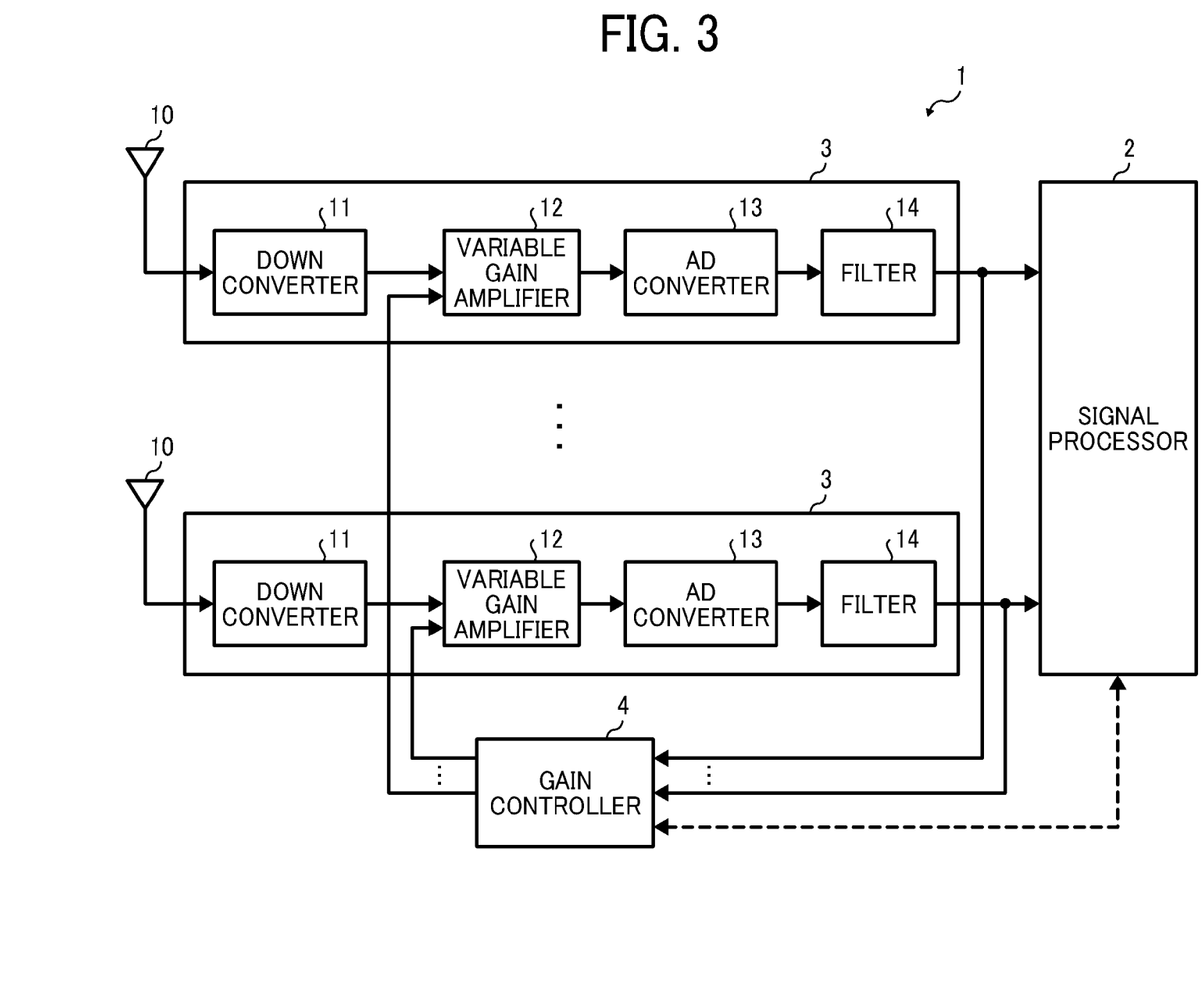
FIG. 3 shows a block diagram of an automatic gain control apparatus according to a first example embodiment.

As shown in FIG. 3, an automatic gain control apparatus 1 according to a first example embodiment may include a plurality of receive chains 3 and a gain controller 4, wherein the automatic gain control apparatus 1 is connectable to a signal processor 2 that processes signals received from each one of the receive chains 3 and communicates with the gain controller 4. FIG. 3 shows a case that two receive chains 3 are employed, but the numbers of receive chains 3 configuring the automatic gain control apparatus 1 is not limited any specific numbers.

As shown in FIG. 3, each one of the receive chains 3 may include an antenna 10, a down converter 11, a variable gain amplifier 12, an analog-to-digital (AD) converter 13, and a filter 14. The antenna 10 receives signals which may be signals of radio frequency (RF) band. The down converter 11 down-converts the signals received from the antenna 10 to baseband signals. The variable gain amplifier 12 amplifies the signals received from the down converter 11. The AD converter 13 receives the analog signals from the variable gain amplifier 12, and converts the analog signals to digital signals. The down converter 11, the AD converter 13, and the filter 14 may or may not be disposed within the receive chain 3.

Figure 4:
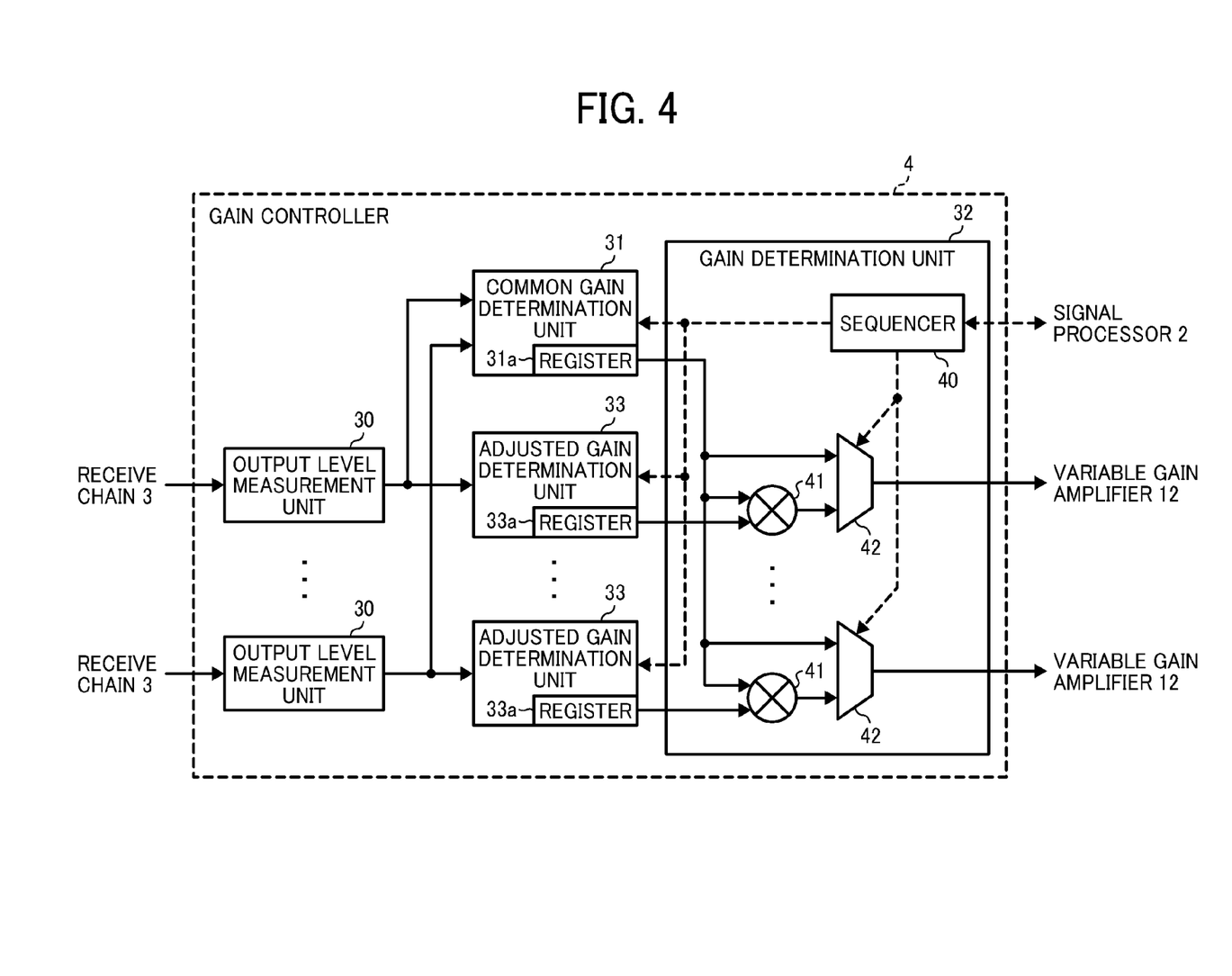
FIG. 4 shows a block diagram of a gain controller of the automatic gain control apparatus of FIG. 3.

As shown in FIG. 4, the gain controller 4 may include a plurality of output level measurement units 30, a common gain determination unit 31, a gain setting unit 32, and a plurality of adjusted gain determination units 33. Each of the output level measurement units 30 measures the output level of the corresponding receive chain 3. The common gain determination unit 31 determines a common gain, which is used as the common gain for every one of the variable gain amplifiers 12. The gain setting unit 32 sets a gain for each one of the variable gain amplifiers 12. Each of the adjusted gain determination units 33 determines an adjusted gain, independently set for corresponding variable gain amplifier 12.

As shown in FIG. 4, the adjusted gain determination unit 33 is disposed for the receive chain 3 one to one basis. For example, two adjusted gain determination units 33 are disposed for two receive chains 3 as shown in FIG. 4. Further, in this disclosure, the output level may mean the output voltage of the receive chain 3, but the amplification of output signal of the receive chain 3 can be used as the output level.

The common gain determination unit 31 determines a common gain based on a statistical value, obtained from the output levels measured by each of the output level measurement units 30. Such statistical value may mean an average value of the output levels measured by the output level measurement units 30. Further, other statistical values such as a maximum value, a minimum value, or a median obtained from the measurement of output levels can be used as the statistical value. The output levels measured by the output level measurement units 30 may vary depending on conditions such as environmental condition of apparatuses, devices, or the like.

The common gain determination unit 31 includes a register 31a to store the common gain while setting an upper limit and a lower limit for the common gain in advance, wherein such upper and lower limits of the common gain may be referred to as a control target range of common gain.

Specifically, 1) when the statistical value obtained from the output levels exceeds the upper limit, the common gain determination unit 31 decreases a value of the common gain; 2) when the statistical value obtained from the output levels is lower than the lower limit, the common gain determination unit 31 increases a value of the common gain; and 3) when the statistical value obtained from the output levels is within from the upper limit to the lower limit (i.e., control target range of common gain), the common gain determination unit 31 determines the common gain.

Upon determining the common gain, the gain setting unit 32 sets the common gain to the variable gain amplifier 12 of every one of the of the receive chains 3. After setting the common gain to the variable gain amplifiers 12, the output level of each of the receive chains 3 is measured again. Based on the measured output level after setting the common gain to the variable gain amplifiers 12, each of the adjusted gain determination unit 33 can determine an adjusted gain for the corresponding variable gain amplifier 12 with a range narrower than the range of common gain, which is a higher precision than the common gain setting. The adjusted gain determination unit 33 includes a register 33a to store the adjusted gain. Specifically, the adjusted gain determination unit 33 may determine an adjusted gain based on a value obtained by dividing a pre-set target value of output level by the measured output level.

For example, the common gain determination unit 31 can determine the common gain with a precision of 12 dB (decibel), and the adjusted gain determination unit 33 can determine the adjusted gain with a precision of 1.5 dB. In such a case, the gain setting unit 32 can set the gains of 48 dB, 24 dB, 12 dB, 6 dB, 3 dB, and 1.5 dB to the variable gain amplifier 12 expressed by six bits, in which the common gain determination unit 31 determines the first three bits, and the adjusted gain determination unit 33 determines the last three bits.

In this example case, the common gain determination unit 31 can determine the common gain in a range of from 0 to 84 dB changeable with a step of 12 dB. The adjusted gain determination unit 33 determines an adjusted gain in a range of from 0 to 10.5 dB, changeable with a step of 1.5 dB, for a value obtained by dividing the pre-set target value of output level by the measured output level.

The gain setting unit 32 may include a sequencer 40, a plurality of multipliers 41, and a plurality of multiplexers 42, wherein the multiplier 41 communicates with the corresponding adjusted gain determination unit 33. Such gain setting unit 32 is used to set a gain for each of the variable gain amplifiers 12. Further, in FIG. 4, the gain value may be used as the gain without further processing. However, in actually-employed configurations, an automatic gain control (AGC) amplifier is used for setting logarithm value of gain value (dB), and an adder is used instead of the multiplier 41.

The sequencer 40 instructs the start and end of operation of the common gain determination unit 31, instructs the start and end of operation of the adjusted gain determination unit 33, transmits a selection signal to the multiplexer 42, and communicates control signals with the signal processor 2.

The multiplier 41 can multiply the common gain determined by the common gain determination unit 31, and the adjusted gain determined by the adjusted gain determination unit 33.

The multiplexer 42 selects any one of the common gain determined by the common gain determination unit 31, and the multiplication result of the multiplier 41 based on the selection signal received from the sequencer 40. With such a configuration, the gain selected by the multiplexer 42 can be set to the corresponding variable gain amplifier 12. Specifically, when the common gain determination unit 31 determines a common gain based on the measured output level of the receive chains 3, the multiplexer 42 selects the common gain, and the common gain is set to the variable gain amplifier 12. When the adjusted gain determination unit 33 determines an adjusted gain based on a value obtained by dividing a pre-set target value of output level by the measured output level, the multiplexer 42 selects the multiplication result of the multiplier 41 obtained by multiplying the common gain and the adjusted gain, and a gain corresponding to the multiplication result is set to the variable gain amplifier 12.

The Institute of Electrical and Electronic Engineers (IEEE) defines the wireless LAN standard, in which the wireless LAN standard of IEEE 802.11n has compatibility with the wireless LAN standard of IEEE 802.11a. To secure the compatibility, high throughput (HT)-mixed packet format includes the 11a-compatible part and 11n-specific part. Each part is defined with one or more sections used for gain control, which may be called as gain control section such as legacy short training field (L-STF) and high throughput short training field (HT-STF). The period of HT-STF is one half of the period of L-STF. Therefore, the time that can be used for gain adjustment in HT-STF is limited.

When a packet having a plurality of gain control sections is received, based on control signals communicated with the signal processor 2, the sequencer 40 instructs the common gain determination unit 31 to determine a common gain at a first gain control section of the packet, and instructs the multiplexer 42 to select the common gain.

Further, after setting the common gain, the sequencer 40 instructs each of the adjusted gain determination unit 33 to determine an adjusted gain for all of the gain control section of the same packet, and instructs each of the multiplexers 42 to select the multiplication result of the multiplier 41.

As such, the determination of the common gain that takes a relatively longer time is conducted for only one time at the first gain control section of the packet, and then the determined common gain is stored in the register 31a of the common gain determination unit 31. Further, after setting the common gain at the first gain control section of the packet, only the determination of the adjusted gain that takes a relatively shorter time is conducted at the first gain control section and at the second gain control section and the subsequent gain control sections. With such a configuration, the time to set the gain for each of the variable gain amplifiers 12 can be set shorter.

Figure 5:
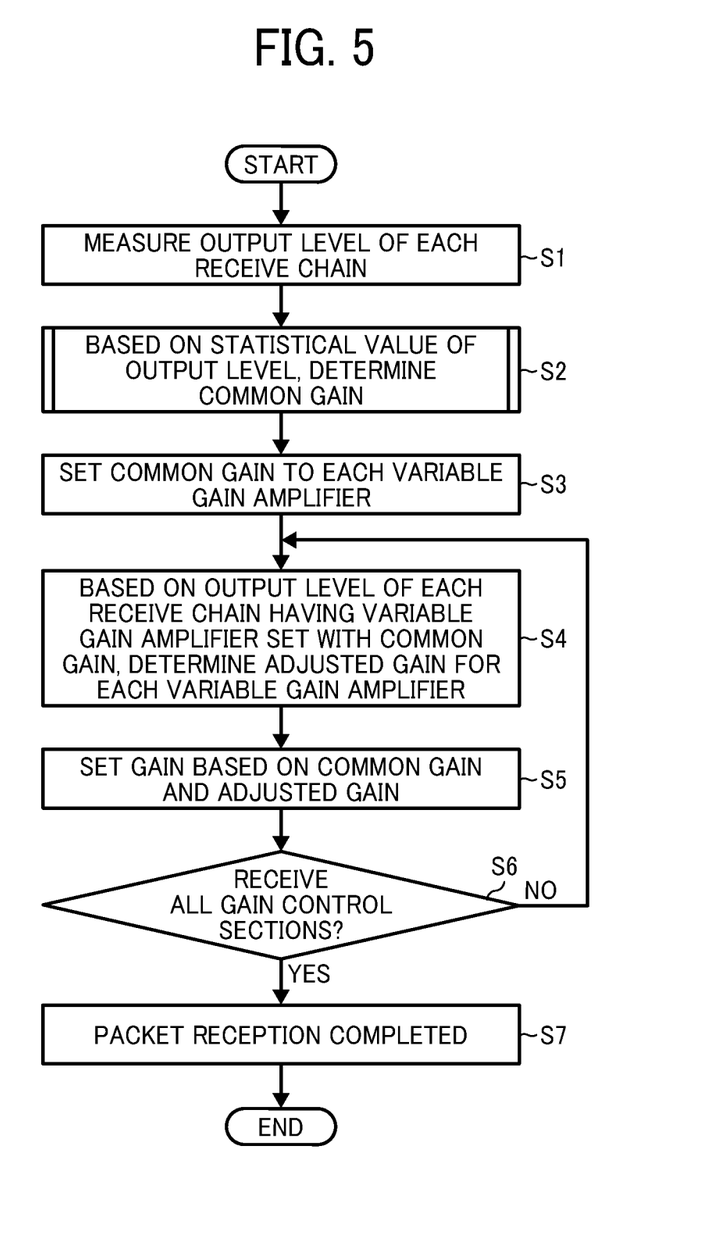
FIG. 5 shows a flowchart of process of automatic gain control operation by the automatic gain control apparatus of FIG. 3.
Figure 6:
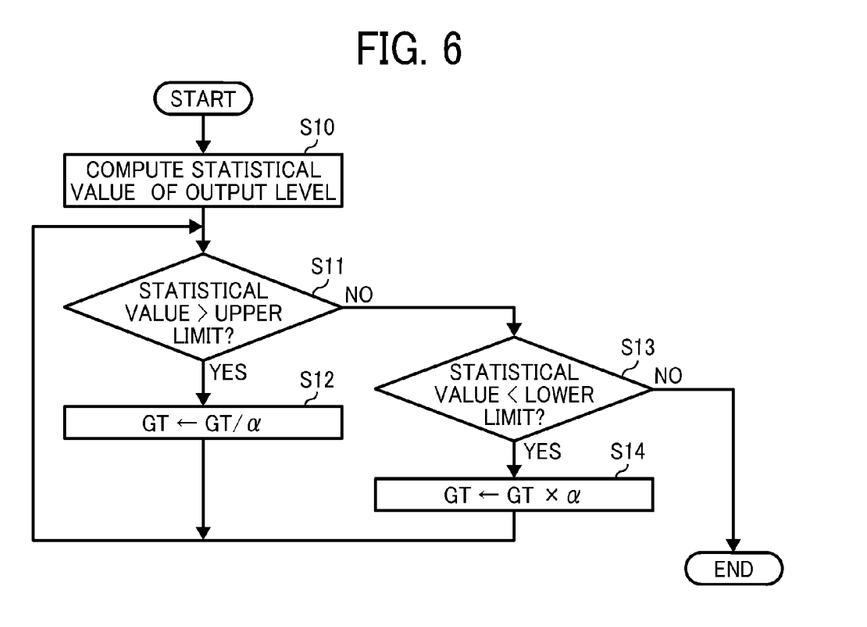
FIG. 6 shows a flowchart of process of one common gain determination process conducted by the automatic gain control operation shown in FIG. 5.
Figure 7:
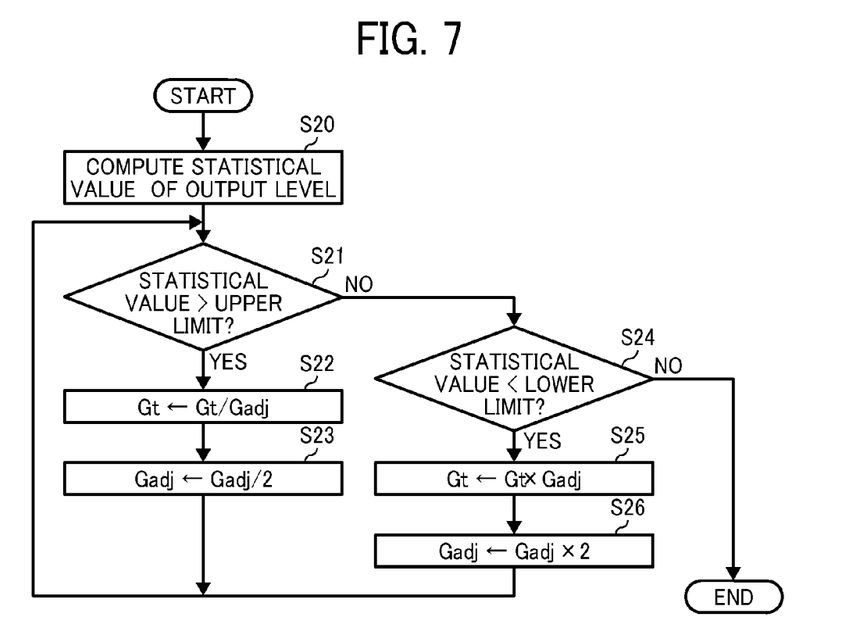
FIG. 7 shows a flowchart of process of another common gain determination process conducted by the automatic gain control operation shown in FIG. 5.

A description is given of automatic gain control operation by the automatic gain control apparatus 1 with reference to FIGS. 5 to 7. The automatic gain control operation may be started when the automatic gain control apparatus 1 receives a signal such as a packet.

Hereinafter, it can be determined that the automatic gain control apparatus 1 receives a signal such as a packet when any one of the output level measurement units 30 receives a signal that exceeds a minimum receiving-level set in advance. In such a configuration, it is preferable to set a given gain to the variable gain amplifier 12 in view of such minimum receiving-level before starting the automatic gain control operation.

Further, it can be determined that the automatic gain control apparatus 1 receives a signal such as a packet when a certain received signal strength indication (RSSI) signal is obtained from a radio frequency (RF) unit of the down converter 11. In this case, the variable gain amplifier 12 is not required to be set with a given gain before starting the automatic gain control operation.

As shown in FIG. 5, the output level of each of the receive chains 3 is measured by the corresponding output level measurement unit 30 at a first gain control section of the packet (step S1: level measurement step).

Then, based on a statistical value obtained from the output levels measured by the output level measurement units 30, a common gain, which is used as the common gain for each of the variable gain amplifiers 12, is determined by the common gain determination unit 31 (step S2: common gain determination step).

The common gain determined by the common gain determination unit 31 is set to each of the variable gain amplifiers 12 by the gain setting unit 32 (step S3: first gain setting step).

After setting the common gain to the variable gain amplifier 12 of every one of the receive chains 3, the output level of each of the receive chains 3 is measured again. Based on the measured output level of each of the receive chains 3, at all gain control sections of the same packet, an adjusted gain is determined independently for each of the variable gain amplifiers 12 by using the corresponding adjusted gain determination unit 33 with a range narrower than the range of common gain, which is a higher precision than the common gain setting (step S4: adjusted gain determination step).

Then, a gain obtained based on the common gain and the adjusted gain is set to the corresponding variable gain amplifier 12 by the gain setting unit 32 (step S5: second gain setting steps). Then, the automatic gain control operation conducts steps S4 and S5 for each gain control section until receiving the all gain control sections (step S6). Then, the determined common gain and adjusted gain are retained, and the process ends when the concerned packet, including the gain control sections and data portion, is completely received (step S7).

A description is given of a common gain determination process conducted at the common gain determination step with reference to FIG. 6. Before conducting the common gain determination process, the upper limit and the lower limit may be set as a control target range of common gain in advance. Hereinafter, the common gain is referred to as Gt, the initial value of common gain is used as a maximum gain of the variable gain amplifier 12, and the common gain is changed with a changing unit α. It should be noted that "Gt" and "α" can be set to any values, as required.

At first, the common gain determination unit 31 computes a statistical value obtained from the output levels measured by each of the output level measurement units 30 (step S10). Then, the common gain determination unit 31 determines whether the computed statistical value exceeds the upper limit (step S11).

If it is determined that the statistical value exceeds the upper limit (step S11: YES), the common gain Gt is divided by the changing unit α to obtain a new common gain Gt (step S12), and then the common gain determination process returns to step S10.

If it is determined that the statistical value does not exceed the upper limit (step S11: NO), the common gain determination unit 31 determines whether the statistical value is lower than the lower limit (step S13).

If it is determined that the statistical value is lower than the lower limit (step S13: YES), the common gain Gt is multiplied by the changing unit α to obtain a new common gain Gt (step S14), and then the common gain determination process returns to step S10.

If it is determined that the statistical value is not lower than the lower limit (step S13: NO), the common gain determination process ends by determining the common gain.

A description is given of another common gain determination process executable at the common gain determination step with reference to FIG. 7. Before conducting the common gain determination process, the upper limit and the lower limit may be set as a control target range of common gain in advance. Hereinafter, the common gain is referred to as Gt, the initial value of common gain is set as G0, an adjustment coefficient of the common gain is referred to as Gadj, and the adjustment coefficient Gadj is set as a half of the initial value of the common gain G0 (i.e., G0/2). It should be noted that "Gt," "G0," and "Gadj" can be set to any values, and "G0" can be divided by given numbers not limited to two.

At first, the common gain determination unit 31 computes a statistical value obtained from the output levels measured by each of the output level measurement units 30 (step S20). Then, the common gain determination unit 31 determines whether the computed statistical value exceeds the upper limit (step S21).

If it is determined that the statistical value exceeds the upper limit (step S21: YES), the common gain Gt is divided by the adjustment coefficient Gadj to obtain a new common gain Gt (step S22), and the adjustment coefficient Gadj is divided by two (2) to obtain a new adjustment coefficient Gadj (step S23), and then the common gain determination process returns to step S20.

If it is determined that the statistical value does not exceed the upper limit (step S21: NO), the common gain determination unit 31 determines whether the statistical value is lower than the lower limit (step S24).

If it is determined that the statistical value is lower than the lower limit (step S24: YES), the common gain Gt is multiplied by the adjustment coefficient Gadj to obtain a new common gain Gt (step S25), and the adjustment coefficient Gadj is multiplied by two (2) to obtain a new adjustment coefficient Gadj (step S26), and the common gain determination process returns to step S20. If it is determined that the statistical value is not lower than the lower limit (step S24: NO), the common gain determination process ends by determining the common gain.

Figure 8:
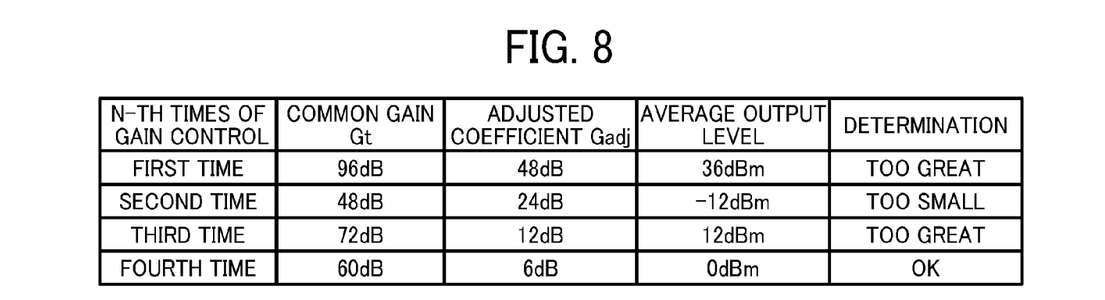
FIG. 8 is an example of data processing for another common gain determination process of FIG. 7.

For example, as shown in FIG. 8, if the initial value of common gain Gt is set, for example, at 96 dB, the initial value of adjustment coefficient Gadj can be set at 48 dB. Further, the control target range of common gain may be set to, for example, a range of ±6 dB. Hereinafter, it is assumed that the average power of all received signals, input to each of the antennas 10, is at −60 dBm.

When the common gain determination process is executed under such condition, the measured average value of output level of the receive chains 3, amplified by the variable gain amplifier 12 of the corresponding receive chain 3, becomes −60 dBm+96 dB=+36 dBm. Because +36 dBm exceeds the control target range of common gain (+6 dB), the common gain Gt and adjustment coefficient Gadj are updated: common gain Gt=96−48=48 dB; adjustment coefficient Gadj=48/2=24 dB.

By using the above updated value, an average output level of second time is measured as −60 dBm+48 dB=−12 dBm. Because −12 dBm is lower than the control target range of common gain (−6 dB), the common gain Gt and adjustment coefficient Gadj are updated: common gain Gt=48+24=72 dB; adjustment coefficient Gadj=24/2=12 dB.

Then, by using the above updated value, an average output level of third time is measured as −60 dBm+72 dB=12 dBm. Because 12 dBm is greater than the control target range of common gain (+6 dB), the common gain Gt and adjustment coefficient Gadj are updated: common gain Gt=72−12=60 dB; adjustment coefficient Gadj=12/2=6 dB.

By using the updated value of third time, an average output level of fourth time is measured as −60 dBm+60 dBm=0 dBm. Because 0 dBm is within the control target range of common gain (±6 dB), the common gain determination process ends.

As above described, based on the statistical value obtained from the output levels of each of the receive chains 3, the automatic gain control apparatus 1 determines a common gain for the variable gain amplifiers 12, and sets the common gain to each of the variable gain amplifiers 12.

Upon setting the common gain to the variable gain amplifier 12 of every one of the receive chains 3, the output level of each of the receive chains 3 is measured again. Based on the measured output level after setting the common gain to each one of the variable gain amplifiers 12, the automatic gain control apparatus 1 determines and sets an adjusted gain independently for each of the variable gain amplifiers 12 with a range narrower than the range of common gain, which is a higher precision than the common gain setting. Therefore, compared to conventional apparatuses, deterioration of receiving performance can be prevented or minimized.

As above described, based on the measured output levels of the entire receive chains 3, a preliminary adjustment of gain can be conducted for all of the receive chains 3 by setting the common gain. Therefore, even if the output level of one specific receive chain 203 becomes too small compared to the output level of the other receive chains 203 due to the effect of interference, the signal of the specific receive chain 203 can be amplified to the same output level of the other receive chains 203 without too great amplification.

In the conventional art, a signal having a lower signal-to-noise ratio (SNR) may be amplified too great, by which a noise component in the received signal may be amplified too great, and then input to the later stage unit such as the signal processor 2, and resultantly signal reception may deteriorate. In contrast, the automatic gain control apparatus 1 according to a first example embodiment can prevent or minimize such deterioration of signal reception.

Further, after setting the common gain, the automatic gain control apparatus 1 determines an adjusted gain based on the difference between the output level of the each receive chain 3 and the pre-set target value of output level, and sets a gain obtained by multiplying the adjusted gain and the common gain to each of the variable gain amplifiers 12. Therefore, if the difference of output levels among the receive chain 3 is within an adjustable range, a gain suitable for each of the variable gain amplifiers 12 can be set variably.

If fluctuation occurs to the output levels of among the receive chains of the automatic gain control apparatus of the conventional art, the receiving performance may deteriorate such as overflow occurs at the receive chain when the analog-to-digital (AD) conversion is conducted, and such as decrease in effective number of bits of signals and resultant increase of quantization noise occurs at the receive chain. The automatic gain control apparatus 1 according to a first example embodiment can prevent or minimize such deterioration of signal reception.

The variable gain amplifier 12 shown in FIG. 3 may be composed with one variable gain amplifier. Further, as shown in FIG. 9, the variable gain amplifier 12 can be composed with a plurality of variable gain amplifiers such as a first variable gain amplifier 50, and a second variable gain amplifier 52.

Figure 9:
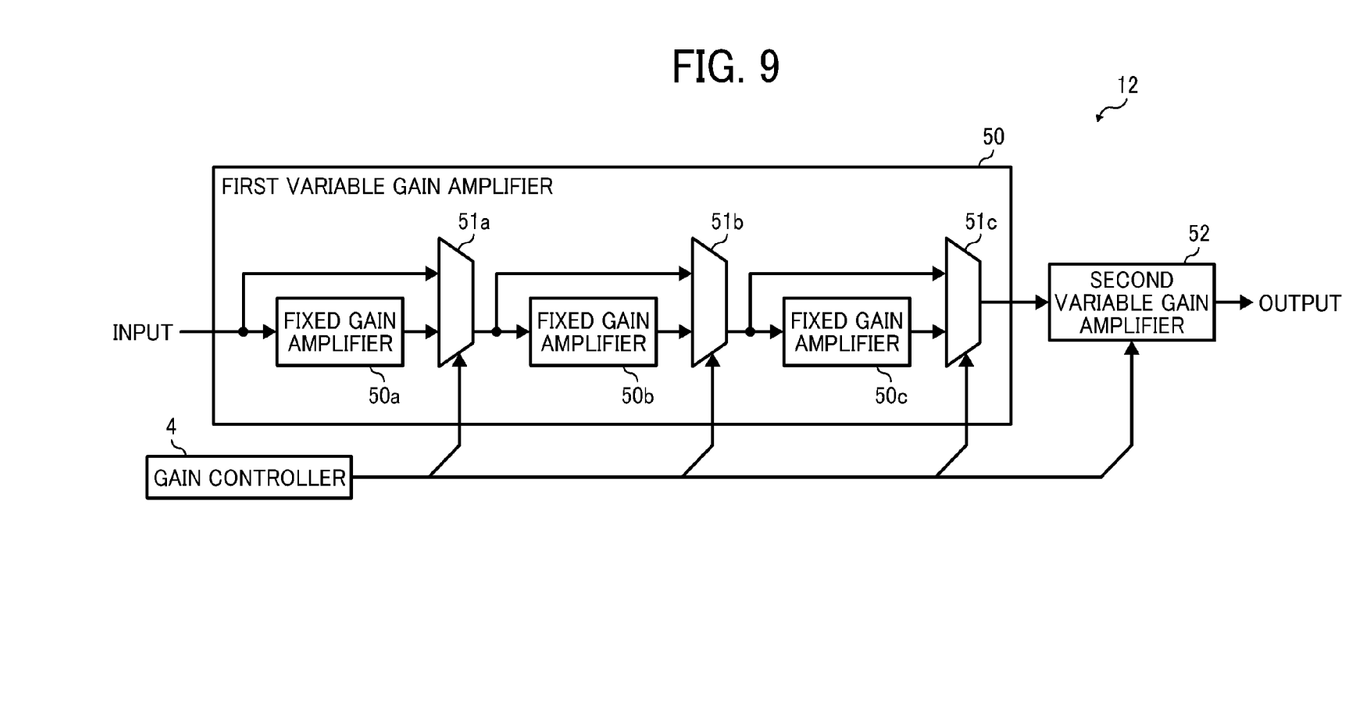
FIG. 9 shows a block diagram of a modified variable gain amplifier employable for the automatic gain control apparatus according to the first example embodiment.

Further, as shown in FIG. 9, the first variable gain amplifier 50 can be composed with a plurality of fixed gain amplifiers 50a to 50c, and a plurality of switches 51a to 51c. Each of the plurality of fixed gain amplifiers 50a to 50c may have different gains. Each of the plurality of switches 51a to 51c is used to set ON/OFF of the corresponding fixed gain amplifiers 50a to 50c. The second variable gain amplifier 52 amplifies signals amplified by the first variable gain amplifier 50.

For example, if the gain setting unit 32 can set the gains of 48 dB, 24 dB, 12 dB, 6 dB, 3 dB, and 1.5 dB to the variable gain amplifier 12 expressed by six bits, a gain of the fixed gain amplifier 50a is set 48 dB, a gain of the fixed gain amplifier 50b is set 24 dB, a gain of the fixed gain amplifier 50c is set 12 dB, and a gain of the second variable gain amplifier 52 is set from 0 to 10.5 dB, by which the variable gain amplifier 12 can function effectively as above described. Further, the combination number of the fixed gain amplifiers and switches can be changed, as required.

Second Example Embodiment

Figure 10:
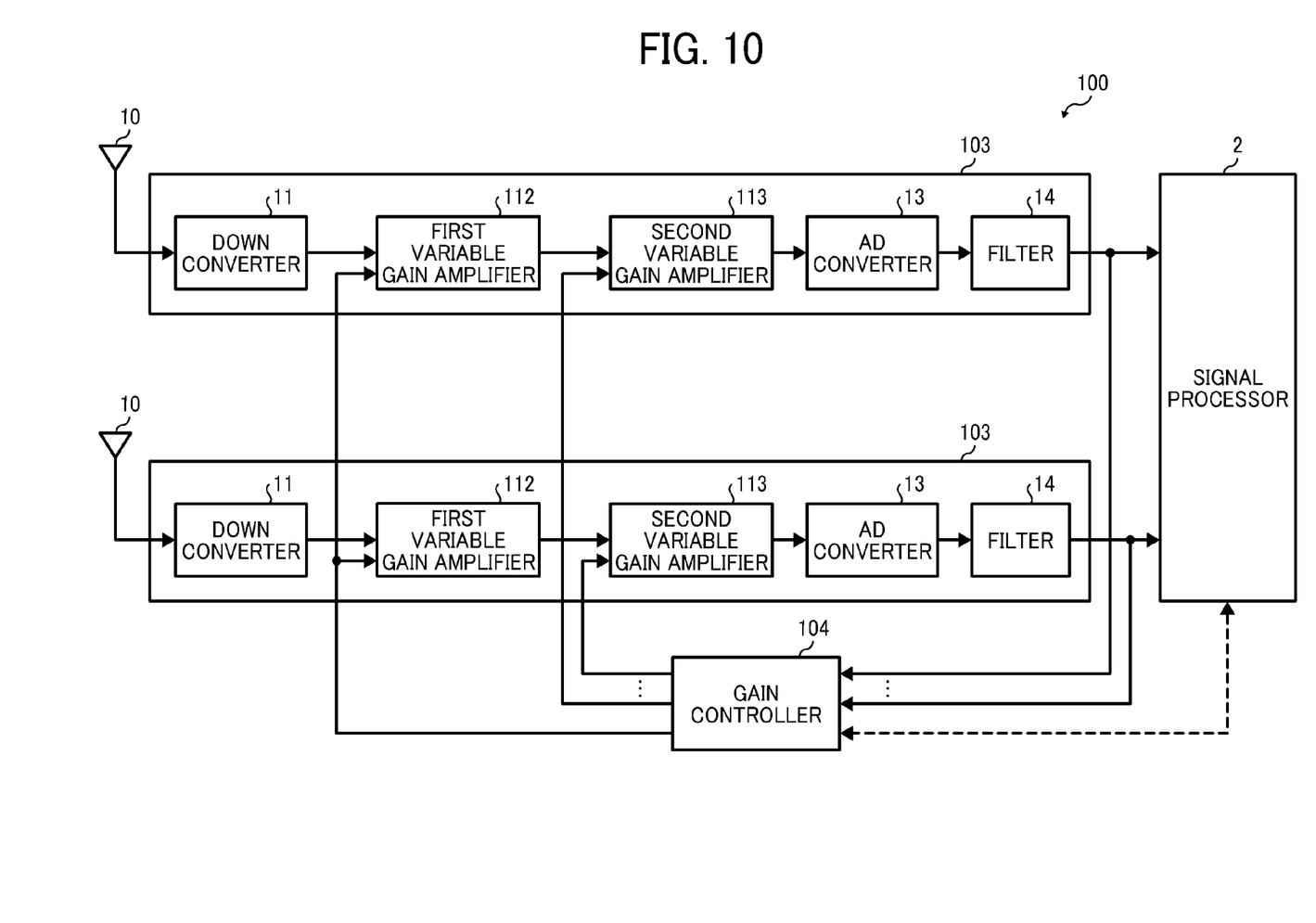
FIG. 10 shows a block diagram of an automatic gain control apparatus according to a second example embodiment.

A description is given of a second example embodiment. As shown in FIG. 10, an automatic gain control apparatus 100 according to a second example embodiment may include a plurality of receive chains 103, and the gain controller 4, wherein the automatic gain control apparatus 100 is connectable to the signal processor 2 that processes signals received from each one of the receive chains 103 and communicates with the gain controller 104. FIG. 10 shows a case that two receive chains 3 are used, but the numbers of receive chain configuring automatic gain control apparatus is not limited any specific numbers.

Some of the composing units of the automatic gain control apparatus 100 according to the second example embodiment may be the same as the composing units of the automatic gain control apparatus 1 according to the first example embodiment, and such same composing units are attached with the same reference characters and the explanation of the same units may be omitted.

The receive chain 103 may include the antenna 10, the down converter 11, a first variable gain amplifier 112, a second variable gain amplifier 113, the AD converter 13, and the filter 14. The first variable gain amplifier 112 amplifies received signals. The second variable gain amplifier 113 further amplifies the signals amplified by the first variable gain amplifier 112.

Figure 11:
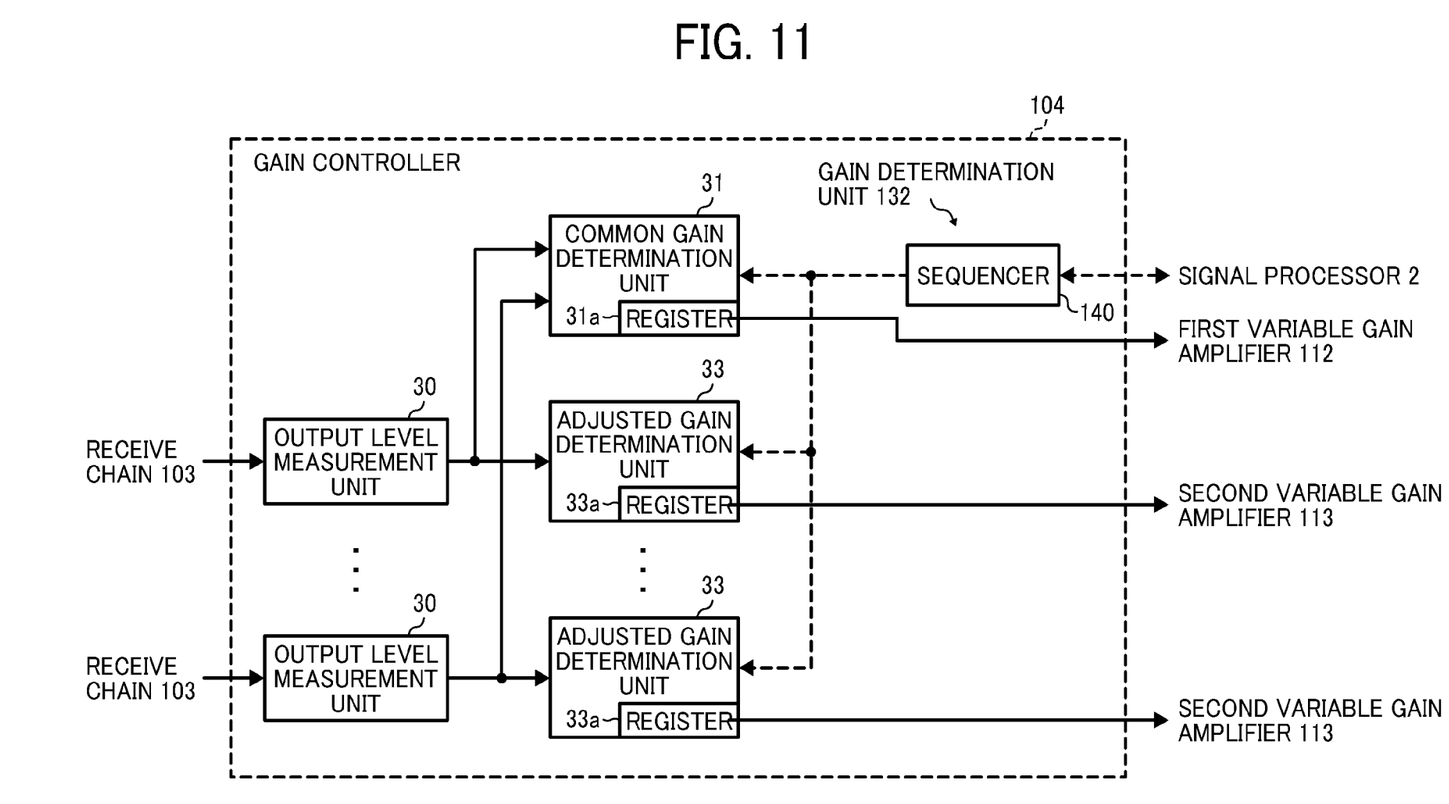
FIG. 11 shows a block diagram of a gain controller of the automatic gain control apparatus of FIG. 10.

As shown in FIG. 11, the gain controller 104 may include the plurality of output level measurement units 30, the common gain determination unit 31, a gain setting unit 132, and the plurality adjusted gain determination units 33. The gain setting unit 132 sets a gain to each of the first variable gain amplifiers 112, and a gain to each of the second variable gain amplifiers 113.

The gain setting unit 132 may include the sequencer 140, and sets a gain to each of the first variable gain amplifiers 112 and a gain to each of the second variable gain amplifiers 113. The sequencer 140 instructs the start and end of operation of the common gain determination unit 31, instructs the start and end of operation of the adjusted gain determination unit 33, and communicates control signals with the signal processor 2.

As similar to the first example embodiment, when a packet having a plurality of gain control sections is to be received, based on control signals communicated with the signal processor 2, the sequencer 140 instructs the common gain determination unit 31 to determine a common gain at a first gain control section of the concerned packet, and sets the common gain determined by the common gain determination unit 31 to each of the first variable gain amplifiers 112.

Further, after setting the common gain, the sequencer 140 instructs each of the adjusted gain determination units 33 to determine an adjusted gain at all gain control sections of the same packet, and sets the adjusted gain determined by each of the adjusted gain determination units 33 to the corresponding second variable gain amplifier 113.

The automatic gain control operation by the automatic gain control apparatus 100 can be conducted as similar to the automatic gain control operation by the automatic gain control apparatus 1 according to the first example embodiment (see FIGS. 5 to 7), thereby the explanation of the automatic gain control operation is omitted. Further, when the automatic gain control operation is conducted by the automatic gain control apparatus 100, it is preferable that each of the second variable gain amplifiers 113 is set with a common initial gain value in advance.

As above described, the automatic gain control apparatus 100 according to the second example embodiment can devise same or similar effect of the automatic gain control apparatus 1 according to the first example embodiment.

Figure 12:
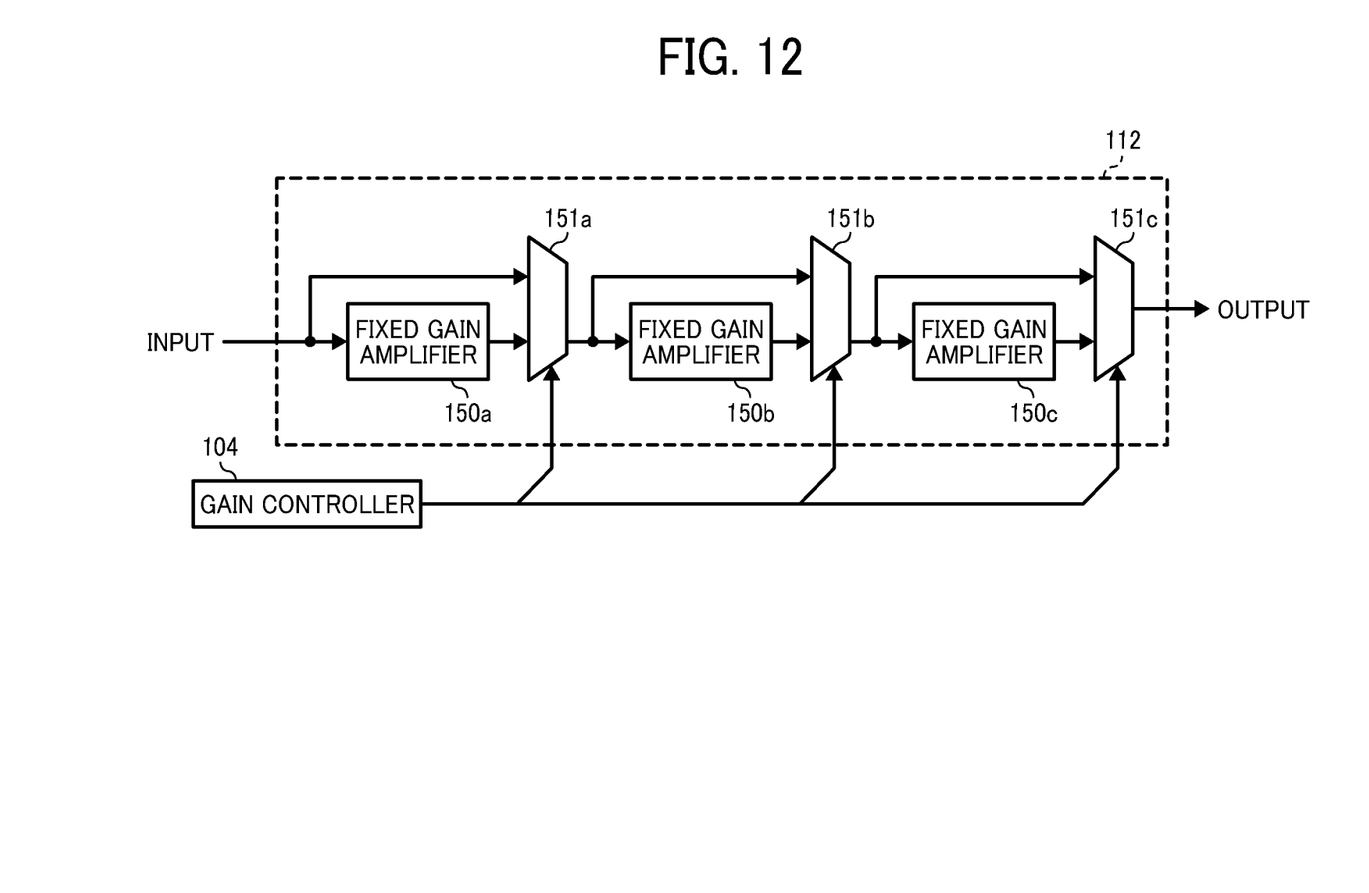
FIG. 12 shows a block diagram of a modified variable gain amplifier employable for a first variable gain amplifier employable for the automatic gain control apparatus of FIG. 10.

The first variable gain amplifier 112 shown in FIG. 10 may be composed with one variable gain amplifier. Further, as shown in FIG. 12, the first variable gain amplifier 112 can be composed with a plurality of fixed gain amplifiers 150a to 150c and a plurality of switches 151a to 151c. Each of the plurality of fixed gain amplifiers 150a to 150c may have different gains. Each of the plurality of switches 151a to 151c is used to set ON/OFF of the corresponding fixed gain amplifiers 150a to 150c.

For example, if the gain setting unit 132 can set the gains of 48 dB, 24 dB, and 12 dB to the first variable gain amplifier 112 expressed by three bits, a gain of the fixed gain amplifier 150a is set 48 dB, a gain of the fixed gain amplifier 150b is set 24 dB, a gain of the fixed gain amplifier 150c is set 12 dB, by which the gain of the first variable gain amplifier 112 can be changed in the range of 0 to 84 dB with a step of 12 dB. Further, the combination number of the fixed gain amplifiers and switches can be changed, as required.

As such, the automatic gain control apparatus and automatic gain control method according to the above described example embodiments can prevent or minimize deterioration of signal receiving performance compared to the conventional art.

The present invention can be implemented in any convenient form, for example using dedicated hardware, or a mixture of dedicated hardware and software. The present invention may be implemented as computer software implemented by one or more networked processing apparatuses. The network can comprise any conventional terrestrial or wireless communications network, such as the Internet. The processing apparatuses can comprise any suitably programmed apparatuses such as a general purpose computer, personal digital assistant, mobile telephone (such as a Wireless Application Protocol (WAP) or 3G-compliant phone) and so on. Since the present invention can be implemented using software and hardware, each and every aspect of the present invention thus encompasses computer software implementable on a programmable device.

The computer software can be provided to the programmable device using any storage medium for storing processor-readable code, such as a flexible disk, a compact disk read only memory (CD-ROM), a digital versatile disk read only memory (DVD-ROM), DVD recording only/rewritable (DVD-R/RW), electrically erasable and programmable read only memory (EEPROM), erasable programmable read only memory (EPROM), a memory card or stick such as universal serial bus (USB) memory, a memory chip, a mini disk (MD), a magneto optical disc (MO), magnetic tape, a hard disk in a server, a solid state memory device or the like, but not limited these.

The hardware platform includes any desired kind of hardware resources including, for example, a central processing unit (CPU), a random access memory (RAM), and a hard disk drive (HDD). The CPU may be implemented by any desired kind of any desired number of processor. The RAM may be implemented by any desired kind of volatile or non-volatile memory. The HDD may be implemented by any desired kind of non-volatile memory capable of storing a large amount of data. The hardware resources may additionally include an input device, an output device, or a network device, depending on the type of the apparatus. Alternatively, the HDD may be provided outside of the apparatus as long as the HDD is accessible. In this example, the CPU, such as a cache memory of the CPU, and the RAM may function as a physical memory or a primary memory of the apparatus, while the HDD may function as a secondary memory of the apparatus.

In the above-described example embodiment, a computer can be used with a computer-readable program, described by object-oriented programming languages such as C++, Java (registered trademark), JavaScript (registered trademark), Perl, Ruby, or legacy programming languages such as machine language, assembler language to control functional units used for the apparatus or system. For example, a particular computer (e.g., personal computer, work station) may control an information processing apparatus using a computer-readable program, which can execute the above-described processes or steps. In the above described embodiments, at least one or more of the units of apparatus can be implemented in hardware or as a combination of hardware/software combination. In example embodiment, processing units, computing units, or controllers can be configured with using various types of processors, circuits, or the like such as a programmed processor, a circuit, an application specific integrated circuit (ASIC), used singly or in combination.

Numerous additional modifications and variations are possible in light of the above teachings. It is therefore to be understood that within the scope of the appended claims, the disclosure of the present invention may be practiced otherwise than as specifically described herein. For example, elements and/or features of different examples and illustrative embodiments may be combined each other and/or substituted for each other within the scope of this disclosure and appended claims.

What is claimed is:

1. An automatic gain control apparatus for a wireless receiver, comprising:
    a plurality of variable gain amplifiers, one variable gain amplifier provided for each one of a plurality of receive chains; and
    a gain controller to control a gain of the variable gain amplifiers provided for the plurality of receive chains, the gain controller comprising:
        a plurality of output level measurement units, each output level measurement unit to measure an output level of a corresponding receive chain;
        a common gain determination unit to determine a common gain for each of the variable gain amplifiers based on a statistical value obtained from the output levels measured by the plurality of output level measurement units;
        a gain setting unit to set a gain to each of the variable gain amplifiers; and
        a plurality of adjusted gain determination units, each adjusted gain determination unit determining an adjusted gain independently for each variable gain amplifier within a range narrower than the range of the common gain based on an output level of a corresponding receive chain measured after the gain setting unit sets the common gain to each one of the variable gain amplifiers of the corresponding receive chains, wherein the gain setting unit sets a gain to each of the variable gain amplifiers based on the common gain and the adjusted gain.

2. The automatic gain control apparatus of claim 1, wherein the gain setting unit sets the gain, obtained by multiplying the common gain and the adjusted gain, to each of the variable gain amplifiers.

3. The automatic gain control apparatus of claim 1, wherein the plurality of variable gain amplifiers include at least a first variable gain amplifier that amplifies a signal and a second variable gain amplifier that further amplifies the signal amplified by the first variable gain amplifier, wherein the gain setting unit sets the common gain to the first variable gain amplifier, and sets the adjusted gain to the second variable gain amplifier while retaining the common gain at the first variable gain amplifier.

4. The automatic gain control apparatus of claim 3, wherein the signal is a packet having a plurality of gain control sections, wherein the common gain determination unit determines the common gain at a first gain control section of the packet, wherein the gain setting unit sets the common gain to each of the variable gain amplifiers, wherein, after setting the common gain, the adjusted gain determination unit determines the adjusted gain at all gain control sections of the packet, wherein the gain setting unit sets a gain based on the common gain and the adjusted gain to each of the variable gain amplifiers.

5. The automatic gain control apparatus of claim 1, wherein the adjusted gain determination unit determines the adjusted gain by dividing a pre-set target value of output level by the measured output level.

6. The automatic gain control apparatus of claim 1, wherein the common gain determination unit has an upper limit and a lower limit of the common gain preset as a control target range of the common gain, wherein when the statistical value obtained from the measured output levels of the receive chains exceeds the upper limit, the common gain determination unit decreases the common gain, wherein when the statistical value obtained from the measured output levels of the receive chains is lower than the lower limit, the common gain determination unit increases the common gain, wherein when the statistical value obtained from the measured output levels of the receive chains is within the control target range defined by the upper limit and the lower limit, the common gain determination unit determines the common gain.

7. An automatic gain control method using an automatic gain control apparatus for a wireless receiver including a plurality of variable gain amplifiers, one variable gain amplifier provided for each of a plurality of receive chains, and a gain controller to control a gain of the variable gain amplifiers provided for each of the plurality of receive chains, the method comprising:

an output level measurement step of measuring an output level of each of the receive chains;

a common gain determination operation of determining a common gain for each of the variable gain amplifiers based on a statistical value obtained from the output level of each of the receive chains measured by the output level measurement operation;

a first gain setting operation of setting the common gain, determined at the common gain determination operation, to each of the variable gain amplifiers;

an adjusted gain determination operation determining an adjusted gain independently for each of the variable gain amplifiers with a range narrower than a range of the common gain based on an output level of the corresponding receive chain measured after setting the common gain to each one of the variable gain amplifiers of the corresponding receive chain; and a second gain setting operation of setting a gain based on the common gain and the adjusted gain to each of the variable gain amplifiers.

8. The automatic gain control method of claim 7, wherein the gain set in the second gain setting operation is obtained by a multiplying the common gain and the adjusted gain.

9. The automatic gain control method of claim 7, wherein the variable gain amplifier includes a first variable gain amplifier having a plurality of fixed gain amplifiers and a plurality of switches that amplifies a signal, and a second variable gain amplifier that further amplifies the signal amplified by the first variable gain amplifier, wherein the first gain setting operation sets the common gain to the first variable gain amplifier, wherein the second gain setting operation sets the adjusted gain to the second variable gain amplifier while retaining the common gain at the first variable gain amplifier.

10. The automatic gain control method of claim 7, wherein the signal is a packet signal having a plurality of gain control sections, wherein the common gain determination operation and the first gain setting operation are conducted at a first gain control section of the packet, wherein the adjusted gain determination operation and the second gain setting operation are conducted at all gain control sections of the packet after setting the common gain.

11. The automatic gain control method of claim 7, wherein the adjusted gain determination operation includes determining the adjusted gain by dividing a pre-set target value of output level by the measured output level.

12. The automatic gain control apparatus of claim 7, wherein the common gain determination operation includes setting an upper limit and a lower limit of the common gain as a control target range of the common gain, wherein when the statistical value obtained from the measured output levels of the receive chains exceeds the upper limit, the common gain determination operation includes decreasing the common gain, wherein when the statistical value obtained from the measured output levels of the receive chains is lower than the lower limit, the common gain determination operation includes increasing the common gain, wherein when the statistical value obtained from the measured output levels of the receive chains is within the control target range defined by the upper limit and the lower limit, the common gain determination operation includes determining the common gain.

* * * * *